(12) United States Patent
Serizawa et al.

(10) Patent No.: US 6,669,501 B2
(45) Date of Patent: Dec. 30, 2003

(54) WIRING CIRCUIT MEMBER FOR VEHICLE

(75) Inventors: Yasuyoshi Serizawa, Shizuoka (JP); Minoru Kubota, Shizuoka (JP); Keizo Nishitani, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 09/989,452

(22) Filed: Nov. 21, 2001

(65) Prior Publication Data

US 2002/0064031 A1 May 30, 2002

(30) Foreign Application Priority Data

Nov. 27, 2000 (JP) .................................... P2000-359714

(51) Int. Cl.⁷ .............................................. H01R 11/20
(52) U.S. Cl. .................. 439/422; 439/34; 439/502; 439/623; 439/67; 439/498; 174/72 A
(58) Field of Search ................... 439/502, 623, 439/422, 423, 424, 67, 498, 34; 174/72 A

(56) References Cited

U.S. PATENT DOCUMENTS

| | | | | |
|---|---|---|---|---|
| 4,560,224 A | * | 12/1985 | Weisenburger | 439/422 |
| 4,718,861 A | * | 1/1988 | Wood | 439/498 |
| 5,460,530 A | * | 10/1995 | Toba et al. | 439/34 |
| 5,507,668 A | * | 4/1996 | Lambrinos et al. | 439/502 |
| 6,118,666 A | * | 9/2000 | Aoki et al. | 439/67 |
| 6,455,950 B1 | * | 9/2002 | Nishitani et al. | 174/72 A |

FOREIGN PATENT DOCUMENTS

JP 8-230585 9/1996

OTHER PUBLICATIONS

Patent Abstracts of Japan, 08–230585, Sep. 10, 1996.

* cited by examiner

*Primary Examiner*—Tho D. Ta
(74) *Attorney, Agent, or Firm*—Sughrue Mion, PLLC

(57) ABSTRACT

A standard circuit unit (200) for a vehicle door includes a first flexible printed circuit member (220a), having a standard switch circuit portion for controlling the operation of a power window drive mechanism, an input/output signal wire (220b), which forms a lead portion for connecting the first flexible printed circuit member (220a) to a host door control unit, and an input/output signal wire (220c) which forms a lead portion for connecting the first flexible printed circuit member (220a) to a courtesy lamp mechanism (13) on a door trim (10). The first flexible printed circuit members (220a) and the input/output signal wires (220b, 220c) are produced separately from each other, and thereafter are fixedly secured to each other by piercing terminals, and therefore are electrically connected together.

4 Claims, 8 Drawing Sheets

WIRING CIRCUIT MEMBER FOR VEHICLE

BACKGROUND OF THE INVENTION

This invention relates to a wiring circuit member which is used for controlling the operations of various electric equipments (such as a power window switch mechanism) mounted on a vehicle.

For example, various electric equipments, such as a power window drive mechanism for opening and closing window panes, a power seat-adjusting mechanism for adjusting the inclination and so on of a driver's seat in accordance with the physical build and posture of the driver, and a courtesy lamp mechanism for warning other running cars by its light that a door of the vehicle, stopped or parked at night, is in an open condition, are mounted on a door trim (interior-side covering plate) of a door panel of the vehicle. These electric equipments are connected directly or through an inner panel-side wire harness to a door control unit (ECU: electronic control unit), and are controlled by this control unit.

A wire harness (comprising wires/cable) for transmitting control signals to electric equipments as described above is arranged and installed in a space between a door panel and a door trim. A lot of blind operation is needed to install the wire harness, and much time and labor is required.

Therefore, in order reduce the time and labor, required for a wire harness-installing operation at the time of mounting electric equipments on a vehicle, an FPC (flexible printed circuit member) which serves as a flat circuit member, is thin, lightweight and flexible, and can achieve an excellent efficiency of the wire harness arranging and installing operation, has attracted attention and has been extensively used as disclosed in JP-A-8-230585.

FIG. 12 is a perspective view of the wire harness (i.e., the related flat circuit member comprising the FPC), disclosed in JP-A-8-230585, as seen from the inside of the passenger room of the vehicle.

In this case, the flat circuit member 3 is installed in a space between a reverse side of a door trim 2 and a door panel 1. One end of the flat circuit member 3 is connected through a plurality of electric connectors 4, 5 and 6 to a switch unit for outputting switch signals for effecting the ON-OFF control of electric equipments such as a power window drive mechanism, a courtesy lamp mechanism and a power seat-arranging mechanism. An electric connector 7, to which operating signals are inputted from the body side, is provided at the other end of the flat circuit member 3.

In the flat circuit member 3, assuming that the power window drive mechanism and the courtesy lamp mechanism are standard equipments, a standard electric circuit for the standard equipments and an optional electric circuit for the optional electric equipment such as the power seat adjusting mechanism are formed integrally to have a single circuit construction.

The mounting positions of the above electric equipments, the switch circuit portion for controlling the operations of these electric equipments and etc., on the vehicle body vary greatly depending on the shape and size of the vehicle body. Therefore, when the kind of vehicle is changed, their mounting positions are varied although the common electric equipments and switch circuit portion are used.

Therefore, lead portions of the flat circuit member 3, connected respectively to the electric connectors 4, 5 and 6, need to be changed in length, and the flat circuit member 3 need to be newly designed and produced for each kind of vehicle.

As mentioned above, the above flat circuit member 3 is the single flat circuit member in which the standard circuit and the optional circuit are formed integrally with each other. Therefore, even with respect to cars of the same kind having the same vehicle body shape and size, this flat circuit member can not meet a switch layout when the optional electric equipment is changed in accordance with a change of the grade of the cars, so that the whole of the flat circuit member, including the standard circuit, must be newly produced.

Namely, with respect to the wiring circuit member comprising the FPC in which the switch circuit portion (control circuit portion) and the lead portions are formed in an integrated manner as described above, various wiring circuit members, having lead portions of different lengths, must be designed and produced in order to meet a change in the vehicle kind, grade and so on, and this invited a problem that the cost increased.

SUMMARY OF THE INVENTION

It is therefore an object of this invention to solve the above problems, and more specifically to provide an inexpensive, good wiring circuit member for a vehicle, which has a high general-purpose ability for a change in the kind and grade of vehicle on which this wiring circuit member is to be mounted, and the production cost can be reduced.

The above object of the present invention has been achieved by a vehicle wiring circuit member for controlling the operations of various electric equipments mounted on a vehicle; characterized in that:

a flexible printed circuit member, forming a switch circuit portion for controlling the operations of the electric equipments, and a flat circuit member, forming a lead portion for connection to other circuit, are produced separately from each other, and thereafter are electrically connected together.

In the above construction, the flexible printed circuit member, forming the switch circuit portion, and the flat circuit member, forming the lead portion, are produced separately from each other, and thereafter are electrically connected together to form the vehicle wiring circuit member of a unitary construction.

Therefore, when the length of the lead portion is changed in accordance with a change in the kind and grade of vehicle, it is merely necessary to newly design and produce only the flat circuit member forming the lead portion changed in length, and the common switch circuit portion can be used regardless of a change in the kind and grade of vehicle.

The flexible printed circuit member and the flat circuit member are beforehand fixedly secured to each other by fixing means such for example as piercing terminals or ultrasonic welding.

Therefore, the provision of a connector structure at the connecting portions of the flexible printed circuit member and the flat circuit member is omitted, and the time and labor, required for a connector fitting operation, are saved.

Any of various flat circuit members, such as an FPC, an FFC (flexible flat cable) and a ribbon wire, can be selectively used as the lead portion in accordance with the mounting condition at the installing place and the environment of use, and there can be provided the vehicle wiring circuit member which has the optimum construction, depending on the mounting position at the vehicle.

The above object of the invention has been achieved also by a vehicle wiring circuit member for controlling the operations of various electric equipments mounted on a vehicle; characterized in that:

a first flexible printed circuit member, forming a standard switch circuit portion for controlling the operations of the standard electric equipments, and a first flat circuit member, forming a lead portion for connection to other circuit, are produced separately from each other, and thereafter are electrically connected together; and a second flexible printed circuit member, forming an optional switch circuit portion for controlling the operations of the optional electric equipments, and a second flat circuit member, forming a lead portion for connection to other circuit, are produced separately from each other, and thereafter are electrically connected together.

In the above construction, the standard circuit unit for controlling the operations of the standard electric equipments and the optional circuit unit for controlling the optional electric equipment are provided as separate units, respectively. Therefore, when the grade of the vehicle is changed, only the optional circuit unit can be easily exchanged, and a newly-designed unit can be post-attached. Therefore, there can be eliminated an uneconomical situation encountered with a standard circuit/optional circuit integration type, in which even the standard circuit, which does not need to be exchanged, is exchanged. Therefore, the operation for mounting the vehicle wiring circuit member on the vehicle can be effected easily, and the efficiency can be enhanced.

DETAILED DESCRIPTION OF PREFERRED EMBODIMENTS

One preferred embodiment of a vehicle wiring circuit member of the present invention will now be described in detail with reference to the accompanying drawings.

Figure 1:
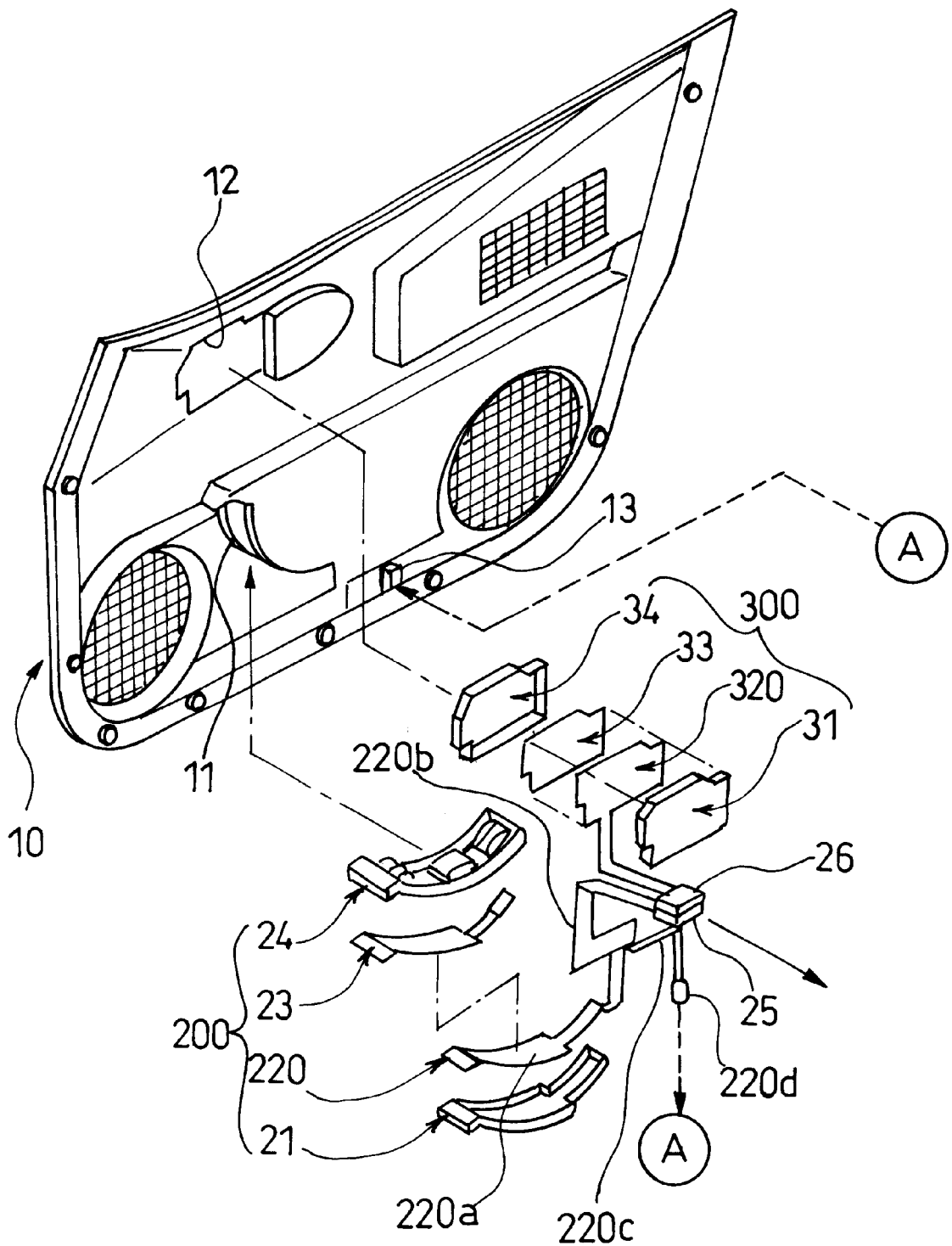
FIG. 1 is an exploded, perspective view showing a vehicle door switch circuit unit employing one preferred embodiment of a vehicle wiring circuit member of the invention.

FIG. 1 is an exploded perspective view showing a vehicle door switch circuit unit employing the vehicle wiring circuit member according to one preferred embodiment of the invention.

The vehicle wiring circuit member in this embodiment is divided into two circuit units, that is, a standard circuit unit 200 for standard electric equipments such as a power window drive mechanism and a courtesy lamp mechanism, and an optional circuit unit 300 for optional electric equipments such as a power seat-adjusting mechanism.

Switch circuits for the standard equipments, such for example as the power window drive mechanism and the courtesy lamp mechanism, which are to be mounted on a door panel regardless of the grade and the like of the cars, are provided at the standard circuit unit 200 in a concentrated manner. Switch circuits for the optional equipments (such as the power seat-adjusting mechanism), which are to be optionally mounted on the door panel in accordance with the grade, are provided at the optional circuit unit 300 in a concentrated manner.

Figure 2:
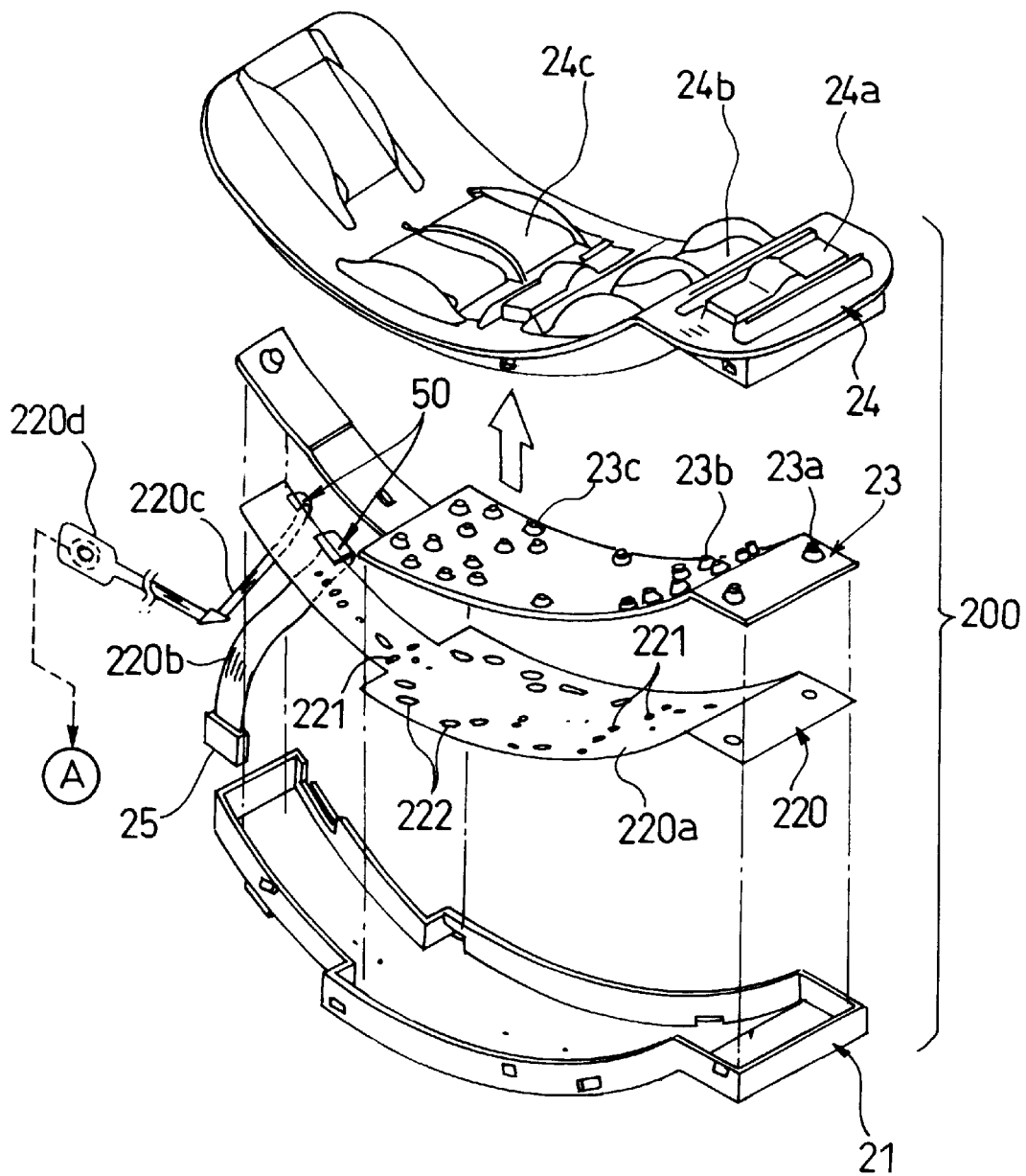
FIG. 2 is an enlarged, exploded perspective view of a standard circuit unit shown in FIG. 1.

As shown in FIG. 2, a wiring circuit member 220, used in the standard circuit unit 200, comprises: a first flexible printed circuit member 220*a*, including a standard switch circuit portion for controlling the operation of the power window drive mechanism by electronic parts 221 and a predetermined number of switch contacts 222 mounted on a wiring circuit; an input/output signal wire (first flat circuit member) 220*b*, which forms a lead portion for connecting the first flexible printed circuit member 220*a* to a door control unit (host drive control circuit); and an input/output signal wire (first flat circuit member) 220*c* which forms a lead portion for connecting the first flexible printed circuit member 220*a* to the courtesy lamp mechanism 13 on a door trim 10.

Figure 4A:
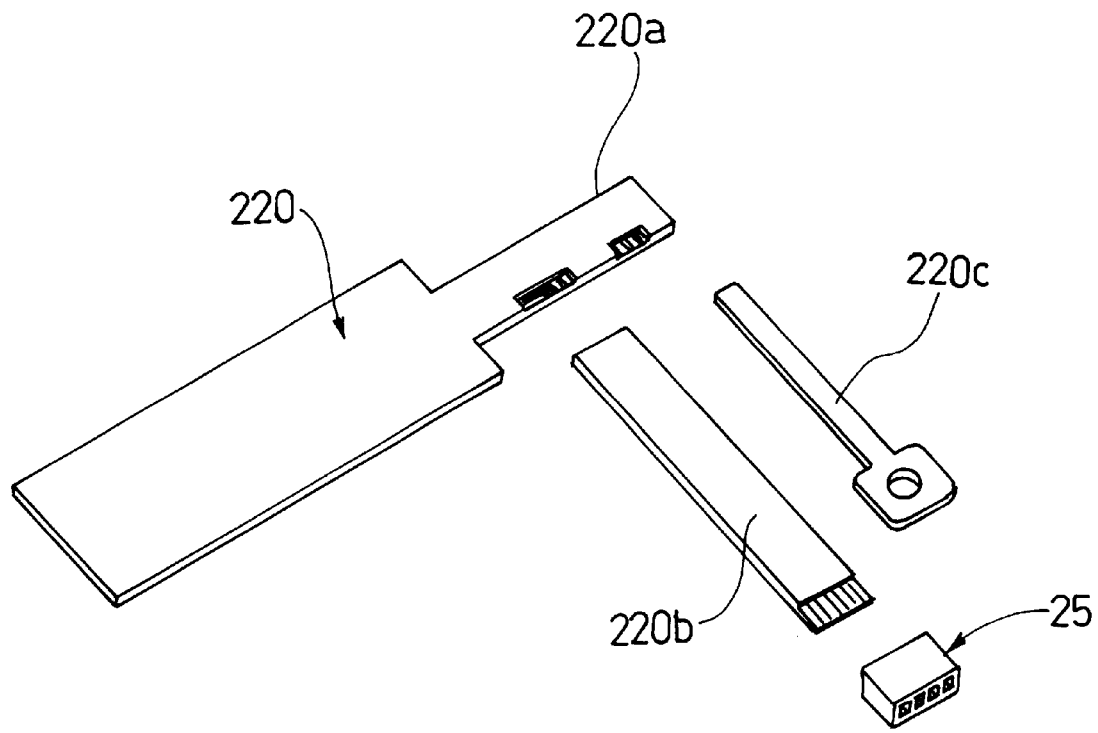
FIG. 4A is an exploded, plan view of a wiring circuit member of the standard circuit unit shown in FIG. 2.

As shown in FIG. 4A, the input/output signal wires 220*b* and 220*c* of the wiring circuit member 220 are produced as independent parts separate from the first flexible printed circuit member 220*a*.

Figure 3:
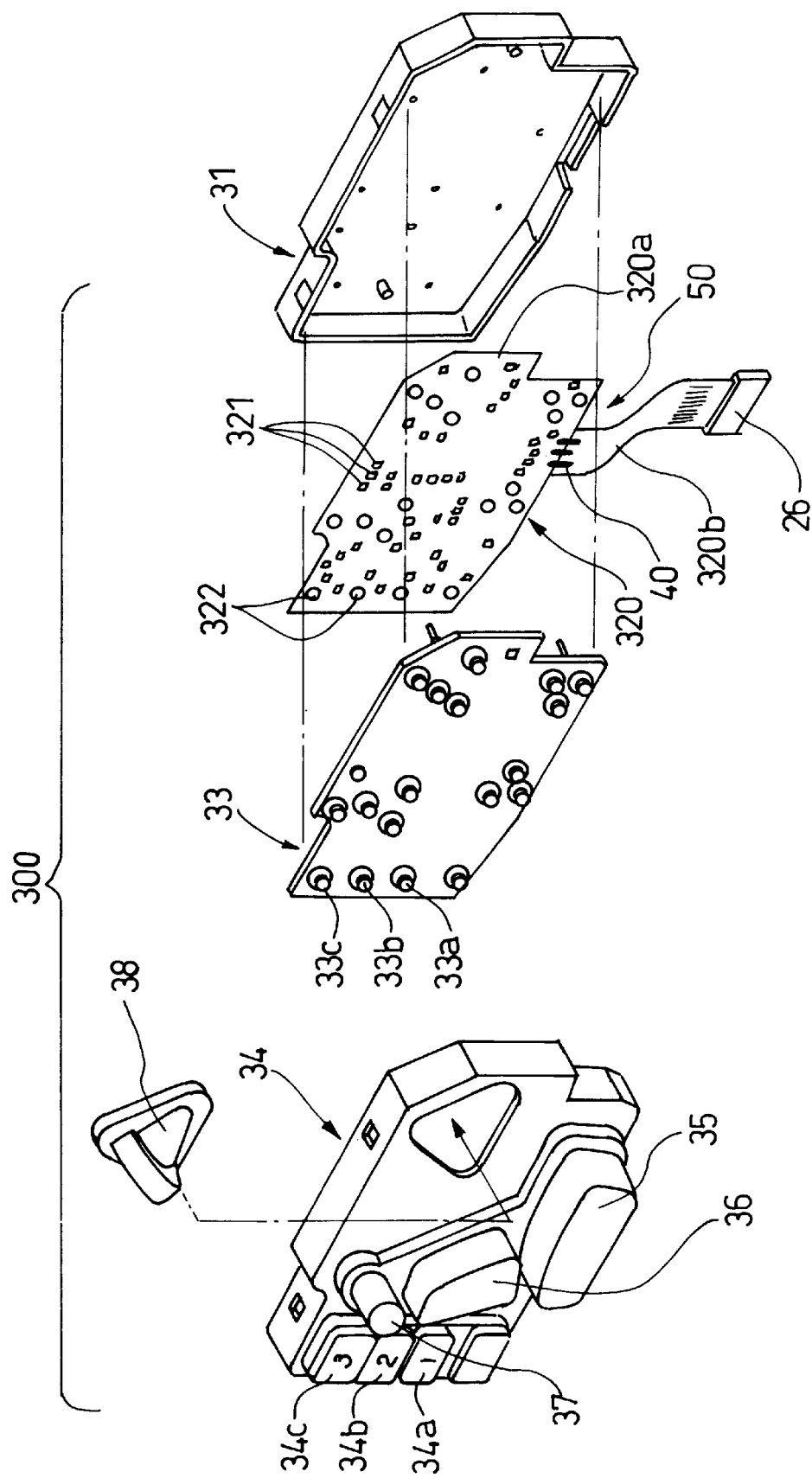
FIG. 3 is an enlarged, exploded perspective view of an optional circuit unit shown in FIG. 1.

As shown in FIG. 3, a wiring circuit member 320, used in the optional circuit unit 300, comprises: a second flexible printed circuit member 320*a*, including an optional switch circuit portion for controlling the operation of the power seat-adjusting mechanism by electronic parts 321 and switch contacts 322 mounted on a wiring circuit; and an input/output signal wire (second flat circuit member) 320*b* which forms a lead portion for connecting the second flexible printed circuit member 320*a* to the host door control unit.

Figure 4B:
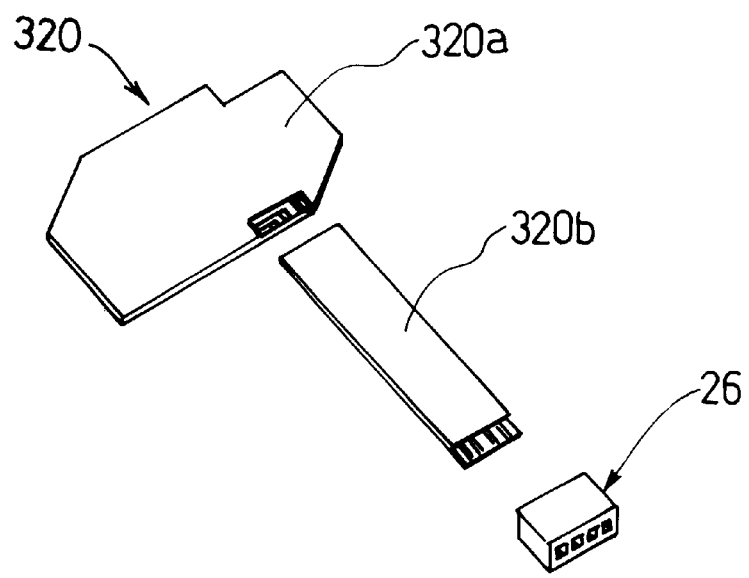
FIG. 4B is an exploded, plan view of a wiring circuit member of the optional circuit unit shown in FIG. 3.

As shown in FIG. 4B, the input/output signal wire 320*b* of the wiring circuit member 320 is produced as an independent part separate from the second flexible printed circuit member 320*a*.

Figure 5A:
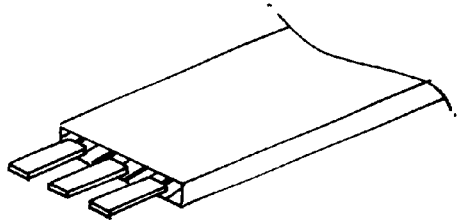
FIGS. 5A to 5C are enlarged perspective views showing flat circuit members used as lead portions of the standard and optional circuit units shown in FIG. 1.
Figure 5B:
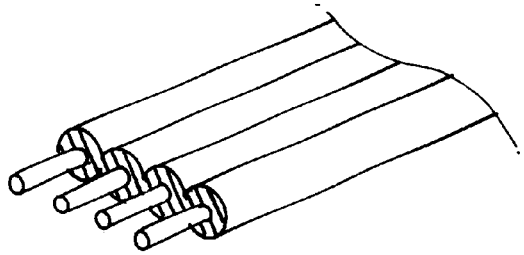
Figure 5C:
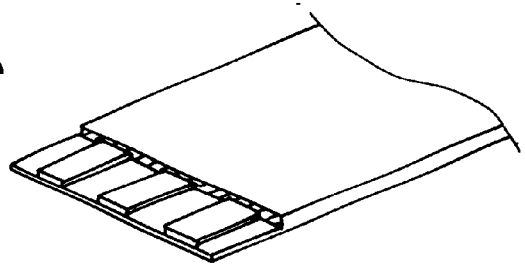

In this embodiment, the input/output signal wires 220*b* and 220*c* and the input/output signal wire 320*b* are flexible flat cables (commonly referred to as "FFC") as shown in FIG. 5A. However, there can be selectively used any of suitable flexible flat circuit members, such as a ribbon wire shown in FIG. 5B and an FPC shown in FIG. 5C, in which a plurality of conductors are arranged and held in a plane at predetermined intervals by a flexible, insulating covering material.

Figure 6:
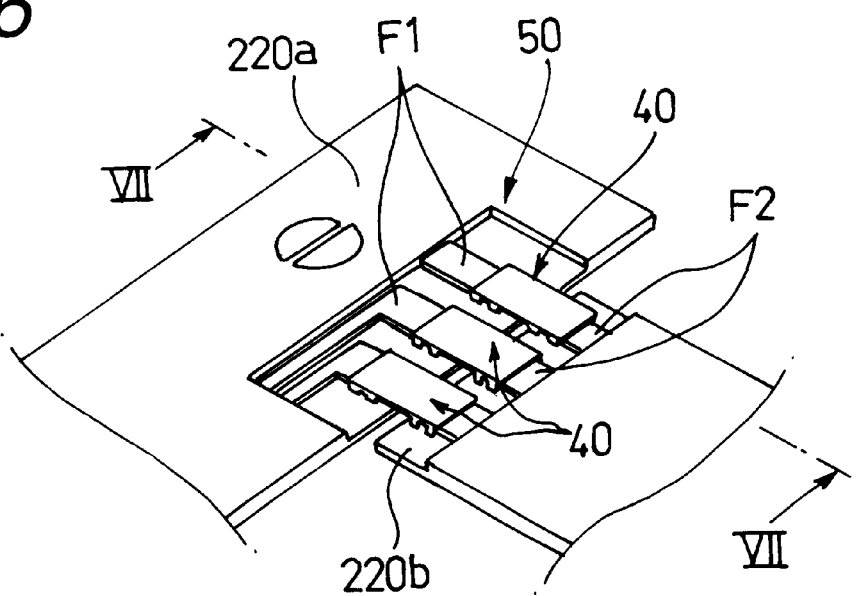
FIG. 6 is a perspective view showing a structure of connecting the flexible printed circuit member and the flat circuit member of the wiring circuit member of FIG. 2 together.
Figure 7:
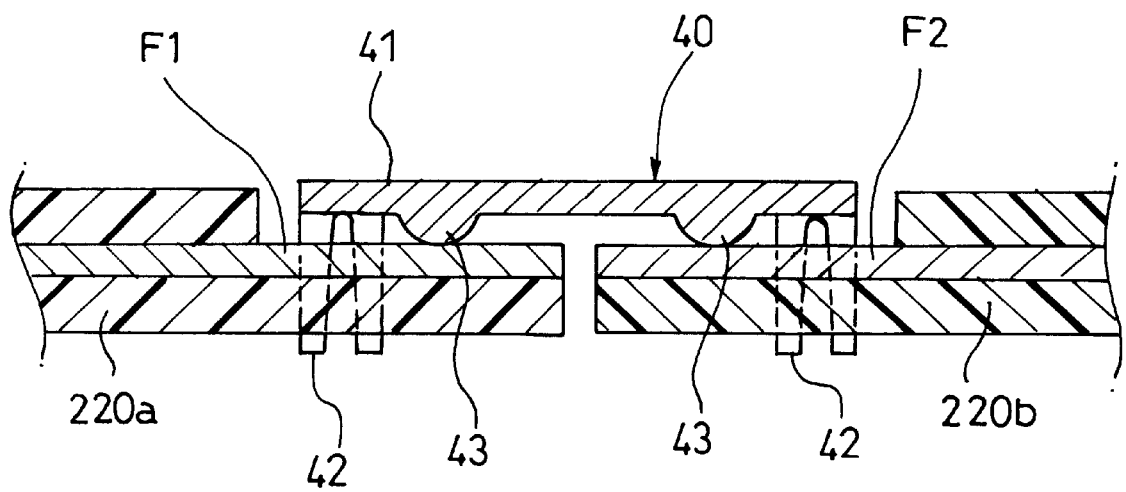
FIG. 7 is a cross-sectional view taken along the line VII—VII of FIG. 6.

In this embodiment, as to the connection of each of the first and second flexible printed circuit members 220a and 320a of the wiring circuit members 220 and 320 to the input/output signal wire(s) 220b and 220c, 320b, for example as shown in FIGS. 6 and 7, each conductor F1 of the first flexible printed circuit member 220a and a corresponding conductor F2 of the input/outputsignalwire220b are beforehand connected together in a bridging manner by a piercing terminal (fixing means) 40 fixedly secured to the circuit member 220a and the signal wire 220b. Therefore, the provision of a connector structure is omitted, and the time and labor, required for a connector fitting operation, are saved.

Figure 8:
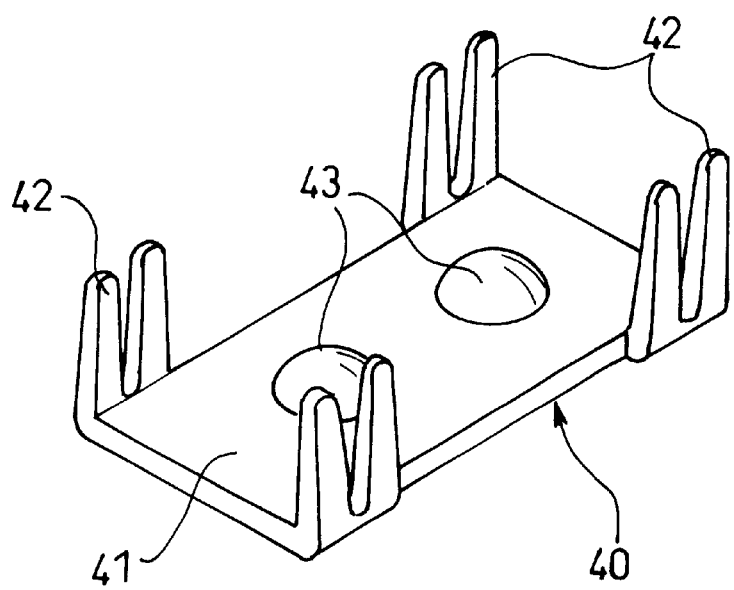
FIG. 8 is a perspective view showing the whole of a piercing terminal shown in FIG. 7.
Figure 9:
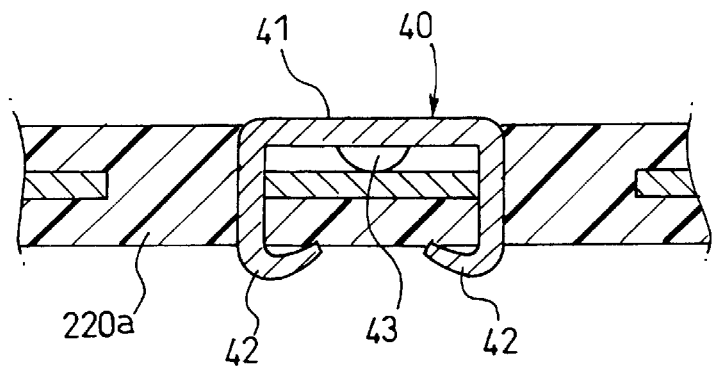
FIG. 9 is a transverse cross-sectional view of the piercing terminal shown in FIG. 7.

More specifically, as shown in FIGS. 8 and 9, the piercing terminal 40 is an electric connection terminal of an integral construction which is made of an electrically-conductive material (e.g. metal material), and includes; a flat portion 41, which interconnects, for example, the conductor F1 of the first flexible printed circuit member 220a and the conductor F2 of the input/output signal wire 220b in a bridging manner; piercing portions 42, which are formed in a projected manner respectively at four corner portions of the flat portion 41, and pierce the first flexible printed circuit member 220a and the input/output signal wire 220b, and are adapted to be deformed by pressing; and a pair of contact projections 43 and 43 which are held in press-contact with the conductors F1 and F2, respectively.

In this embodiment, insulating covering members are suitably peeled from connecting portions 50 of the first flexible printed circuit member 220a and the input/output signal wire 220b, respectively, and the pair of contact projections 43 and 43 are held in press-contact with the peeled conductors F1 and F2, thereby making the electrical connection, as shown in FIGS. 6 and 7. However, the piercing terminal 40 may be formed into such a construction that its piercing portions 42 can pierce the insulating covering members as well as the two conductors, thereby electrically connecting the two conductors together.

As shown in FIG. 2, the first flexible printed circuit member 220a, used in the wiring circuit member 220 of the standard circuit unit 200, is provided between a lower casing 21 for power window switches and an upper casing 24 (serving as a switch knob cover), with a rubber contact 23 superposed on an upper surface thereof, and is attached to a curved recess portion 11 of the door trim 10 through these upper and lower casings 24 and 21.

The input/output signal wire 220b, extending from the first flexible printed circuit member 220a, is wired to the inner side of the door trim 10, and is connected to the host door control unit (not shown) through a connector 25 provided at a distal end thereof.

The input/output signal wire 220c is wired to the inner side of the door trim 10, and is connected to the courtesy lamp mechanism 13 on the door trim 10 through a lamp circuit board 220d provided at a distal end thereof. In FIG. 1, for convenience' sake, the connection between the lamp circuit board 220d and the courtesy lamp mechanism 13 is indicated by broken lines designated by reference characters A and A.

The rubber contact 23 is such a switch mechanism that contact opening-closing conductors for respectively opening and closing the switch contacts 222, printed on the upper surface of the first flexible printed circuit member 220a, are supported respectively by raised rubber walls 23a, 23b, 23c ... in spaced relation to the respective switch contacts 222.

The upper and lower casings 24 and 21 are formed into a curved shape corresponding to the curved shape of the curved recess portion 11. Operating knobs 24a, 24b, 24c ... for pressing the rubber walls 23a, 23b, 23c ... of the rubber contact 23 so as to open and close the switch contacts 222 on the first flexible printed circuit member 220a are attached to the upper casing 24.

As shown in FIG. 3, the second flexible printed circuit member 320a, used in the wiring circuit member 320 of the optional circuit unit 300, is provided between a lower casing 31 and an upper casing 34 for power seat switches, with a rubber contact 33 superposed on an upper surface thereof, and is mounted in a mounting window 12 in the door trim 10 through these upper and lower casings 34 and 31.

The input/output signal wire 320b, extending from the second flexible printed circuit member 320a, is wire to the inner side of the door trim 10, and is connected to the host door control unit (not shown) through a connector 26 provided at a distal end thereof.

The rubber contact 33 is such a switch mechanism that contact opening-closing conductors for respectively opening and closing the switch contacts 322, printed on the upper surface of the second flexible printed circuit member 320 a, are supported respectively by raised rubber walls 33a, 33b, 33c ... in spaced relation to the respective switch contacts 322.

A seat switch 35, a backrest switch 36, a headrest switch 37 and a tilt telescopic switch 38 (which are operating knobs) for determining the adjusting portions of the power seat as well as adjusting amounts are mounted on the upper casing 34. Further, operating knobs 34a, 34b and 34c for memorizing the amounts of operations of these switches in a plurality of patterns are mounted on this upper casing. These operating knobs can press the respective rubber walls 33a, 33b, 33c of the rubber contact 33 to close the respective switch contacts 322 on the second flexible printed circuit member 320a.

Next, an example of procedure of mounting the above vehicle door switch circuit unit on the door trim 10, as well as its operation, will be described.

First, the standard circuit unit 200 is easily arranged and installed on the door trim 10, with the electric connector remaining in a free condition, so that this unit is ready for electrical connection to the power window drive mechanism and the courtesy lamp mechanism (which are the standard equipments) and also for electrical connection to the door control unit. Even when the kind and grade of vehicle are changed, this standard circuit unit 200 can, in most cases, meet such change.

Then, the optional circuit unit 300, prepared as a separate unit, is easily arranged and installed on the door trim 10, with the electric connector 26 remaining in a free condition, so that this unit is ready for electrical connection to the power seat-adjusting mechanism and also for electrical connection to the door control unit.

Figure 10:
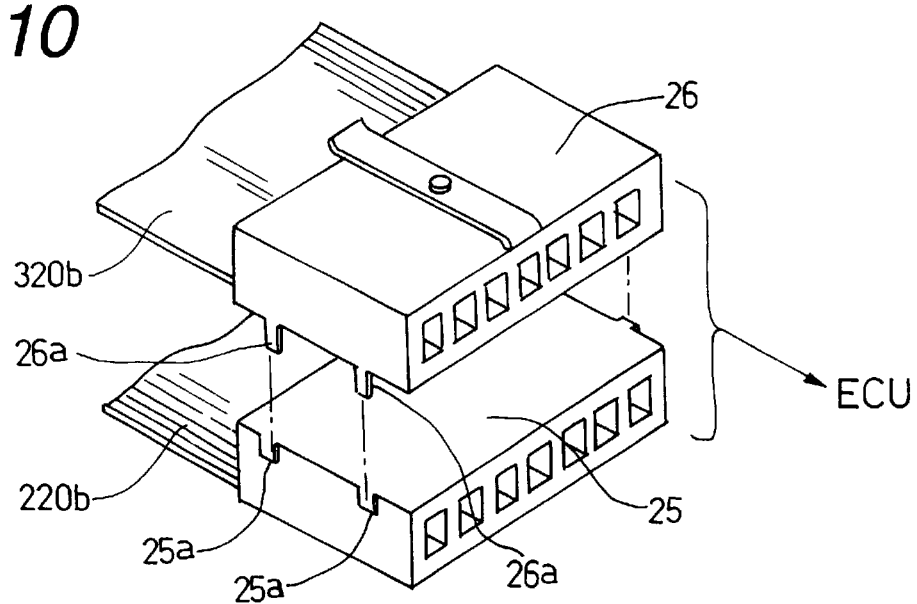
FIG. 10 is a perspective view showing an engagement structure of electric connectors connected respectively to the lead portions of the standard and optional circuit units of FIG. 1.

At the next stage, the electric connectors 25 and 26, provided respectively at the input/output signal wires 220b and 320b of the standard circuit unit 200 and the optional circuit unit 300, are combined together in an unitary manner substantially with a one-touch operation by engagement members 16 (comprising engagement projections 25a, formed on the connector 25, and retaining piece portions 26a formed on the connector 26) in such a manner that the two connectors are stacked one upon another, as shown in FIG. 10. These connectors are connected as a single connector to a connector provided at the host door control unit (not shown).

In this condition, switch ON-OFF signals can be transmitted from the wiring circuit member 220 of the standard circuit unit 200 and the wiring circuit member 320 of the optional circuit unit 300 to the door control unit. Namely, the wiring circuit member 220 can output the switch signals for effecting the ON-OFF control of the power window drive mechanism and the courtesy lamp mechanism (which are the standard equipments), and the wiring circuit member 320 can output the switch signals for effecting the ON-OFF control of the power seat drive mechanism which is the optional equipment.

During this assembling operation, the electric connectors 25 and 26 are combined together, and are electrically connected to the door control unit. Therefore, the handling ability is far more efficient as compared with the related construction in which the standard circuit and the optional circuit are separately connected to the control unit. And besides, in the related construction, the standard circuit and the optional circuit are formed integrally with each other, and therefore the electric connectors hang from the opposite ends of the FPC of an increased length, and the conductors of the FPC may be cut during transport and the installing operation. In this embodiment, this disadvantage is eliminated.

In the wiring circuit member 220 of the vehicle wiring circuit member of the vehicle door switch circuit unit of this embodiment, the first flexible printed circuit member 220a having the standard switch circuit portion, and the input/output signal wires 220b and 220c are produced separately from each other, and thereafter these are fixedly secured to each other by the piercing terminals 40, and are electrically connected together to form the vehicle wiring circuit member of a unitary construction.

When the lengths of the input/output signal wires 220b and 220c (which serve as the lead portions) are changed in accordance with a change in the kind of vehicle, it is merely necessary to newly design and produce only the flat circuit members changed in length, and the common first flexible printed circuit member 220a can be used regardless of a change in the kind of vehicle unless the first flexible printed circuit member 220a need to be changed because of a change in the power window drive mechanism, the courtesy lamp mechanism or others.

In the wiring circuit member 320, the second flexible printed circuit member 320a having the optional switch circuit portion, and the input/output signal wire 320b are produced separately from each other, and thereafter the two are fixedly secured to each other by the piercing terminals 40 so as to electrically connected together to form the vehicle wiring circuit member of a unitary construction. Therefore, when the length of the input/output signal wire 320b (which serves as the lead portion) is changed in accordance with a change in the kind of vehicle, it is merely necessary to newly design and produce only the flat circuit member changed in length, and unless the second flexible printed circuit member 320a need to be changed because of a change in the power seat-adjusting mechanism or others, the common second flexible printed circuit member 320a can be used regardless of a change in the kind of vehicle, and therefore provides a high general-purpose ability.

Further, in the vehicle door switch circuit unit of the above embodiment, the standard circuit unit 200 for controlling the operations of the power window drive mechanism and the courtesy lamp mechanism (which are the standard equipments), and the optional circuit unit 300 for controlling the operation of the power seat-adjusting mechanism (which is the optional equipment) are provided as separate units, respectively. Therefore, when the grade of the vehicle is changed, only the optional circuit unit 300 can be easily exchanged, and a newly-designed unit 300 can be post-attached. Therefore, there can be eliminated an uneconomical situation encountered with a standard circuit/optional circuit integration type, in which even the standard circuit, which does not need to be exchanged, is exchanged. Therefore, the operation for mounting the switch circuit unit on the vehicle can be effected easily, and the efficiency can be enhanced.

Each of the input/output signal wires 220b, 220c and 320b is fixedly secured to the respective first and second flexible printed circuit member 220a, 320a by the piercing terminals 40, and is electrically connected thereto to provide the vehicle wiring circuit member of a unitary construction. Therefore, any of various flat circuit members, such as an FPC, an FFC and a ribbon wire, can be selectively used in accordance with the mounting condition at the installing place and the environment of use, and there can be provided the vehicle wiring circuit member which has the optimum strength and installing ability, depending on the mounting position and mounting condition at the vehicle.

Namely, for example, when each of the input/output signal wires is formed by an FPC, and is formed integrally on a flexible printed circuit member in a pattern, this input/output signal wire has an increased length, and therefore a cover lay film or the like need to be formed on the surface of each input/output signal wire so as to insulate the same and also to increase a tensile strength of the input/output signal wire. This increases the cost.

Further, when the pattern configuration of each wiring circuit member becomes large and complicated as a result of integral formation of the input/output signal wire in a pattern on the flexible printed circuit member, an useless area of a substrate increases, and besides the number of electronic parts to be mounted on the flexible printed circuit member is reduced, and there is a possibility that the production cost is increased by the increased mounting cost.

In the vehicle door switch circuit unit according to this embodiment, each of the input/output signal wires 220b, 220c and 320b is produced separately from the respective first and the second flexible printed circuit member 220a, 320a, and thereafter is fixedly secured thereto by the piercing terminals 40, and is electrically connected thereto, to form the vehicle wiring circuit member of a unitary construction having the desired configuration. Therefore, even when the pattern configuration of the wiring circuit member becomes large and complicated, a useless area of each wiring circuit member 220, 320 can be reduced to a minimum, thereby reducing the production cost. Further, the increase of the cost can be suppressed by using FFCs or ribbon wires as the input/output signal wires.

In the above embodiment, although the vehicle wiring circuit member is used in the vehicle door switch circuit unit, and is divided into the two circuit units, that is, the standard circuit unit 200 and the optional circuit unit 300, the present invention can be applied to a vehicle wiring circuit member for controlling the operation of any other electric equipment mounted on the vehicle, and this vehicle wiring circuit member can take any other suitable form on the basis of the subject matter of the invention.

Figure 11:
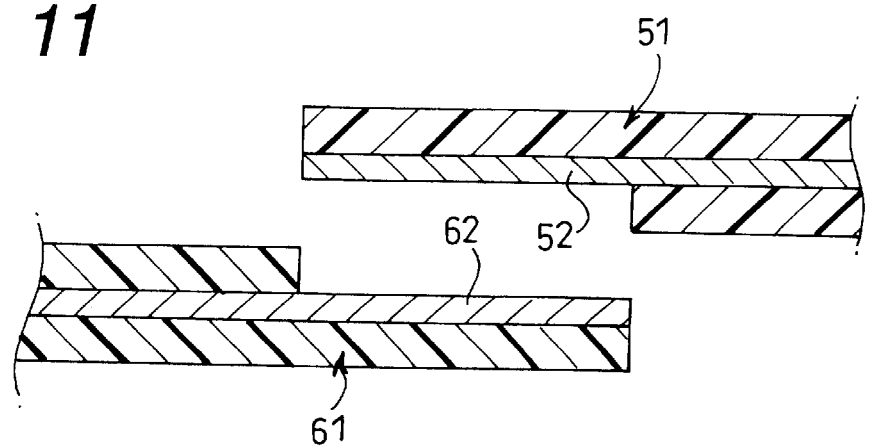
FIG. 11 is a longitudinal cross-sectional view other structure of connecting the flexible printed circuit member and the flat circuit member of the vehicle wiring circuit member of the invention together.
Figure 12:
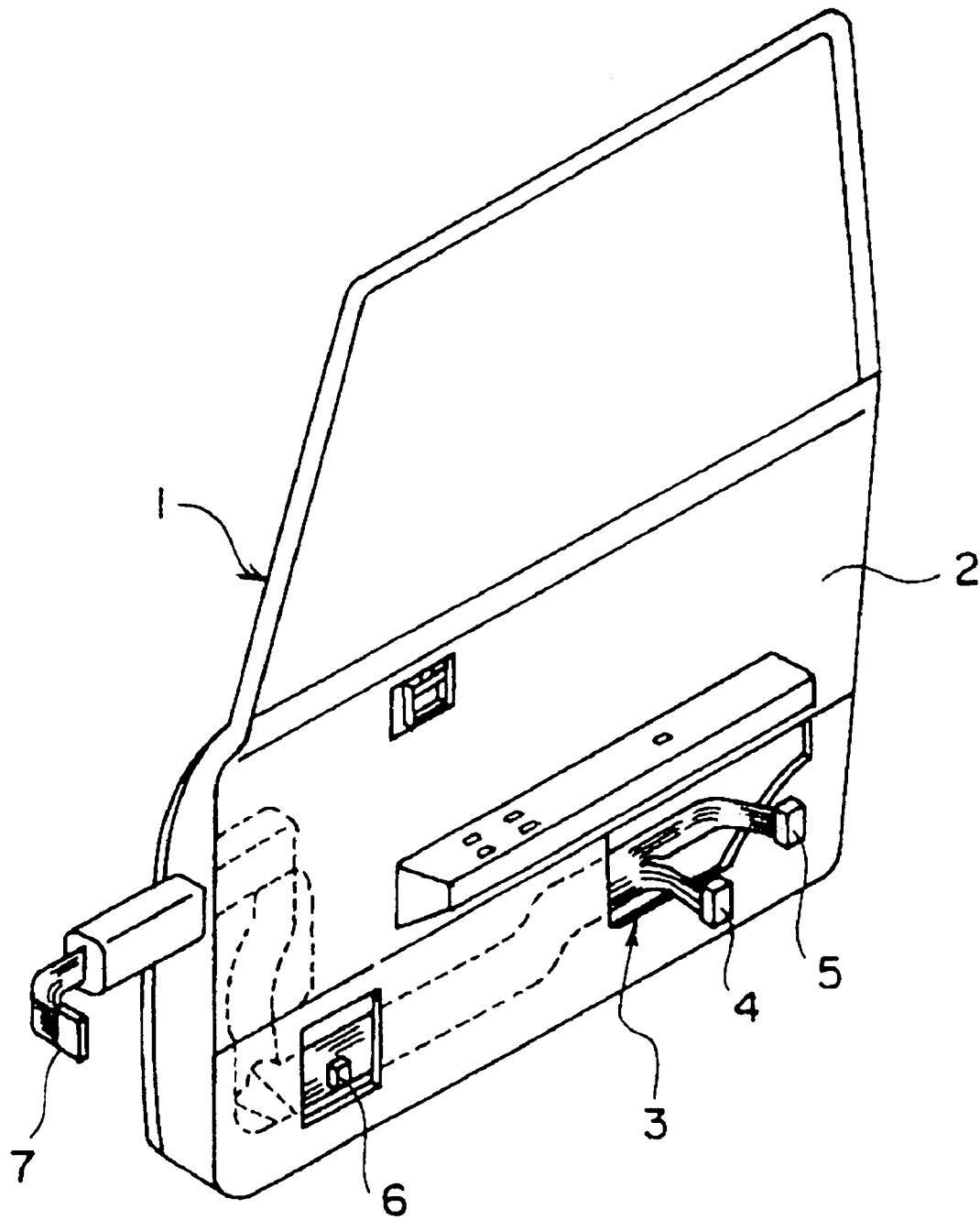
FIG. 12 is a perspective view of a door wire harness, employing a conventional FPC, as seen from the inside of a passenger room of a vehicle.

In the above embodiment, although each of the input/output signal wires 220b, 220c and 320b is beforehand fixedly secured to the respective first and the second flexible printed circuit member 220a, 320a by, the piercing terminals 40, there can be used a method in which insulating covering members are suitably removed from connecting portions 50 of a flexible printed circuit member 61 and an input/output signal wire 51, respectively, and exposed conductors 62 and 52 are superposed together, and are welded and connected together by ultrasonic welding or the like, as shown in FIG. 11. Other fixing means, such as soldering, can be used.

As described above, in the vehicle wiring circuit member of the present invention, the flexible printed circuit member, forming the switch circuit portion, and the flat circuit member, forming the lead portion, are produced separately from each other, and thereafter are electrically connected together to form the vehicle wiring circuit member of a unitary construction.

Therefore, when the length of the lead portion is changed in accordance with a change in the kind and grade of vehicle, it is merely necessary to newly design and produce only the flat circuit member forming the lead portion changed in length, and the common switch circuit portion can be used regardless of a change in the kind and grade of vehicle.

The flexible printed circuit member and the flat circuit member are beforehand fixedly secured to each other by the fixing means such for example as the piercing terminals or ultrasonic welding.

Therefore, the provision of a connector structure at the connecting portions of the flexible printed circuit member and the flat circuit member is omitted, and the time and labor, required for a connector fitting operation, are saved.

Any of various flat circuit members, such as an FPC, an FFC (flexible flat cable) and a ribbon wire, can be selectively used as the lead portion in accordance with the mounting condition at the installing place and the environment of use, and there can be provided the vehicle wiring circuit member which has the optimum strength and installing ability, depending on the mounting position and mounting condition at the vehicle.

What is claimed is:

1. A vehicle wiring circuit member for controlling electric equipment mounted on a vehicle comprising:

a flexible printed circuit member including conductors, an insulating covering material covering the conductors, and a switch circuit portion for controlling the electric equipments wherein an electric part is mounted on the flexible printed circuit member; and a linear two-ended flexible flat circuit member including conductors, an insulating covering material covering the conductors and a lead portion for connection to wire harness, wherein the flexible printed circuit member and the flat circuit member are produced separately from each other and thereafter are electrically connected together.

2. The vehicle wiring circuit member according to claim 1 further comprising a piercing terminal for electrically connecting the flexible printed circuit member to the flat circuit member by piercing the flexible printed circuit member and the flat circuit member.

3. A vehicle wiring circuit member for controlling electric equipment mounted on a vehicle comprising:

a first flexible printed circuit member including a standard switch circuit portion for controlling operations of standard electric equipment, and a first flat circuit member including a lead portion for connection to another circuit, wherein the first flexible printed circuit member and the first flat circuit member are produced separately from each other, and thereafter are electrically connected together; and a second flexible printed circuit member including an optional switch circuit portion for controlling operations of optional electric equipment, and a second flat circuit member including a lead portion for connection to another circuit, wherein the second flexible printed circuit member and the second flat circuit member are produced separately from each other, and thereafter are electrically connected together.

4. The vehicle wiring circuit member according to claim 3 further comprising:

a first connector provided to a distal end of the first flat circuit member; and a second connector provided to a distal end of the second flat circuit member, wherein the first connector and the second connector are capable of being combined together.

* * * * *